US011799050B2

(12) United States Patent
Kim et al.

(10) Patent No.: US 11,799,050 B2
(45) Date of Patent: Oct. 24, 2023

(54) SOLAR CELL AND SOLAR CELL MODULE INCLUDING THE SAME

(71) Applicant: KOREA UNIVERSITY RESEARCH AND BUSINESS FOUNDATION, Seoul (KR)

(72) Inventors: Donghwan Kim, Yangpyeong-gun (KR); Hae-Seok Lee, Seoul (KR); Yoonmook Kang, Seoul (KR); Soohyun Bae, Seoul (KR); Sang-Won Lee, Uiwang-si (KR); HyunJung Park, Seoul (KR); Jae-Keun Hwang, Seoul (KR); Wonkyu Lee, Seoul (KR); Jiyeon Hyun, Seoul (KR); Solhee Lee, Seoul (KR)

(73) Assignee: KOREA UNIVERSITY RESEARCH AND BUSINESS FOUNDATION, Seoul (KR)

(*) Notice: Subject to any disclaimer, the term of this patent is extended or adjusted under 35 U.S.C. 154(b) by 0 days.

(21) Appl. No.: 17/776,715

(22) PCT Filed: Oct. 15, 2020

(86) PCT No.: PCT/KR2020/014089
§ 371 (c)(1),
(2) Date: May 13, 2022

(87) PCT Pub. No.: WO2021/096078
PCT Pub. Date: May 20, 2021

(65) Prior Publication Data
US 2022/0406958 A1   Dec. 22, 2022

(30) Foreign Application Priority Data
Nov. 13, 2019 (KR) .................. 10-2019-0144989

(51) Int. Cl.
*H01L 31/00* (2006.01)
*H01L 31/18* (2006.01)
(Continued)

(52) U.S. Cl.
CPC .. *H01L 31/1868* (2013.01); *H01L 31/022466* (2013.01); *H01L 31/0465* (2014.12); *H01L 31/0687* (2013.01)

(58) Field of Classification Search
CPC ......... H01L 31/1868; H01L 31/022466; H01L 31/0465; H01L 31/0687; H01L 31/02168;
(Continued)

(56) References Cited

U.S. PATENT DOCUMENTS

2017/0358398 A1   12/2017   Beaumont
2018/0374976 A1   12/2018   Peibest

FOREIGN PATENT DOCUMENTS

EP    3 270 432 A1    1/2018
JP    2010-534409 A   11/2010
(Continued)

OTHER PUBLICATIONS

International Search Report dated Mar. 9, 2021, in connection with International Patent Application No. PCT/KR2020/014089; with English translation.
(Continued)

*Primary Examiner* — Angelo Trivisonno
(74) *Attorney, Agent, or Firm* — Hauptman Ham, LLP

(57) ABSTRACT

Disclosed are a solar cell including an upper cell includes an upper passivation layer disposed on an upper surface of a functional layer, a transparent electrode disposed on an upper surface of the upper passivation layer, an upper first charge transport layer disposed on an upper surface of the transparent electrode, an upper electrode disposed on the upper first of the transparent electrode to be adjacent to the (Continued)

upper surface charge transport layer, an upper second charge transport layer disposed on the upper surface of the functional layer to be spaced apart from the upper passivation layer, the transparent electrode, the upper first charge transport layer, and the upper electrode, and an upper absorption layer disposed on the upper passivation layer, the transparent electrode, the upper first charge transport layer, and the upper second charge transport layer.

20 Claims, 10 Drawing Sheets

(51) Int. Cl.
H01L 31/0224 (2006.01)
H01L 31/0687 (2012.01)
H01L 31/0465 (2014.01)

(58) Field of Classification Search
CPC .......... H01L 31/02167; H01L 31/0725; H01L 31/076; H01L 31/0352; H10K 85/50; H10K 30/40; H10K 30/84; Y02E 10/544
See application file for complete search history.

(56) References Cited

FOREIGN PATENT DOCUMENTS

| | | |
|---|---|---|
| JP | 2014-220351 A | 11/2014 |
| KR | 10-2009-0028987 A | 3/2009 |
| KR | 10-2011-0024376 A | 3/2011 |
| KR | 10-2012-0013731 A | 2/2012 |
| KR | 10-2013-0011598 A | 1/2013 |
| KR | 10-1464086 B1 | 11/2014 |
| KR | 10-1716149 B1 | 3/2017 |
| KR | 10-2018-0011832 A | 2/2018 |
| KR | 10-2019-0016927 A | 2/2019 |
| KR | 10-1958930 B1 | 3/2019 |
| KR | 10-2019-0053374 A | 5/2019 |

OTHER PUBLICATIONS

Written Opinion dated Mar. 9, 2021, in connection with International Patent Application No. PCT/KR2020/014089.
Shockley-Queisser detailed-balance efficiency limit chart, Amolf, Mar. 17, 2022, 1 page.
Rao et al., "Harnessing singlet exciton fission to break the Shockley-Queisser limit," Nature Reviews, Oct. 4, 2017, vol. 2, Article No. 17063, 12 pages.
Lee et al., "Halide Perovskites for Tandem Solar Cells," The Journal of Physical Chemistry Letters, Apr. 19, 2017, vol. 8, pp. 1999-2011.
Bremner et al., "Analysis of Tandem Solar Cell Efficiencies Under AM1.5G Spectrum Using a Rapid Flux Calculation Method," Progress in Photovoltaics: Research and Applications, Nov. 19, 2007, vol. 16, pp. 225-233.
Mailoa et al., "A 2-terminal perovskite/silicon multijunction solar cell enabled by a silicon tunnel junction," Applied Physics Letters, Mar. 24, 2015, vol. 106, Article No. 121105, 5 pages.
Albrecht et al., "Monolithic perovskite/silicon-heterojunction tandem solar cells processed at low temperature," Energy & Environmental Science, Oct. 27, 2015, vol. 9, pp. 81-88.
Bush et al., "23.6%-efficient monolithic perovskite/silicon tandem solar cells with improved stability," Nature Energy, Feb. 17, 2017, vol. 2, Article No. 17009, 7 pages.
Sahli et al., "Fully textured monolithic perovskite/silicon tandem solar cells with 25.2% power conversion efficiency," Nature Materials, Sep. 2018, vol. 17, pp. 820-826.
Zheng et al., "Large area efficient interface layer free monolithic perovskite/homo-junction-silicon tandem solar cell with over 20% efficiency," Energy & Environmental Science, Jun. 25, 2018, vol. 11, pp. 2432-2443.
"Best Research-Cell Efficiencies", NREL, 1 page.
Nogay et al., "25.1%-Efficient Monolithic Perovskite/Silicon Tandem Solar Cell Based on a p-type Monocrystalline Textured Silicon Wafer and High-Temperature Passivating Contacts," ACS Energy Letters, Mar. 12, 2019, vol. 4, pp. 844-845.
Kamino et al., "Low-Temperature Screen-Printed Metallization for the Scale-Up of Two-Terminal Perovskite-Silicon Tandems," ACS Applied Energy Materials, Apr. 29, 2019, vol. 2, pp. 3815-3821.
Zheng et al., "21.8% Efficient Monolithic Perovskite/Homo-Junction-Silicon Tandem Solar Cell on 16 cm2," ACS Energy Letters, Aug. 31, 2018, vol. 3, pp. 2299-2300.
Yoshikawa et al., "Silicon heterojunction solar cell with interdigitated back contacts for a photoconversion efficiency over 26%," Nature Energy, Mar. 20, 2017, vol. 2, Article No. 17032, 8 pages.
Desa et al., "Silicon back contact solar cell configuration: A pathway towards higher efficiency," Renewable and Sustainable Energy Reviews, Mar. 24, 2016, vol. 60, pp. 1516-1532.
Chen et al., "Causes and Solutions of Recombination in Perovskite Solar Cells," Advanced Materials, Sep. 17, 2018, vol. 31, Article No. 1803019, 56 pages.
"Spectral Irradiance", www.viridiansolar.co.uk, 1 page.
Yu et al, "Selecting tandem partners for silicon solar cells," Nature Energy, Sep. 26, 2016, vol. 1, Article No. 16137, 4 pages.

SOLAR CELL AND SOLAR CELL MODULE INCLUDING THE SAME

CROSS-REFERENCE TO RELATED APPLICATION

The present application is a national stage filing under 35 U.S.C. § 371 of PCT application number PCT/KR2020/014089 filed on Oct. 15, 2020, which is based upon and claims the benefit of priority to Korean Patent Application No. 10-2019-0144989, filed on Nov. 13, 2019, in the Korean Intellectual Property Office. Both of the aforementioned applications are incorporated herein by reference in their entireties.

TECHNICAL FIELD

The present disclosure relates to a solar cell, and a solar cell module including the same.

STATEMENT REGARDING GOVERNMENT-SPONSORED RESEARCH OR DEVELOPMENT

The present disclosure was derived from a study performed as a part of an energy technology development business (subject serial number: 20193091010490, project management institute: Korea Institute of Energy Technology Evaluation and Planning, project title: Super solar cell that overcoming theoretical limit efficiency (30%) of silicon solar cell, managing department: Industry-university cooperation group of Korea University, project period: Sep. 1, 2019 to May 31, 2012, and contribution rate: 1/2) of Ministry of Trade and Industry of Korea. The present disclosure was derived from a study performed as a part of an new renewable energy core technology development (subject serial number: 20183010014470, study management institute: Korea Institute of Energy Technology Evaluation and Planning, study title: 30 cm×30 cm class ultra-high-efficiency, flexible, and high-stability perovskite solar cell module development, managing department: Industry-university cooperation group of Korea University, study period: 2022 Jan. 1 to 2023 Mar. 31, contribution rate: 1/2).

Meanwhile, the present disclosure has no property benefit of Korean Government in all aspects.

BACKGROUND ART

The global warming problem has become severe all over the world. To overcome this, in 2015, the world nations made a Paris climate change agreement for maintaining an average temperature rise of the earth at a level that is lower than 2 degrees. Accordingly, to prevent global warming, it is essential to reduce use of existing fossil energy and develop new renewable energy that may replace the fossil energy.

The new renewable energy is energy that reutilizes existing fossil fuels or converts the existing fossil fuels to regenerative energy to use it, and includes solar energy, geothermal energy, ocean energy, and bio energy.

Among them, the solar energy or the sunlight does not cause contaminations, is indefinite, and may be used anywhere in the earth. The solar cell has been developed to utilize the solar energy, and is an element that converts light energy generated by the sun into electrical energy by using a photovoltaic effect.

Although various solar cells using an organic material, an inorganic material, or an organic/inorganic hybrid material have been developed, among the total power productions, electric power developed by using solar cells is still at a low level. This is because the power generation costs of the solar cells are higher than costs of general electric power produced by using fossil fuels. An efficiency of the solar cells is an important factor for determining power generation costs of the solar cells, and it is important to enhance the efficiency of the solar cells to increase price competitiveness.

In recent years, 26% or more of silicon solar cells have been successfully developed and the solar cells have been steadily grown up, but a theoretical efficiency that may be realized by using silicon solar cells of a current structure is 29.4% and there is a limit in enhancement of efficiency.

The currently commercialized solar cell structure has a single junction structure, and thus there is a limit in using light coming from the sun as a whole. To overcome this, it is necessary to implement a multi-junction solar cell that efficiently uses spectrums of the sunlight by stacking the solar cells having a band gap that may absorb a specific wavelength band. Then, a theoretical efficiency limit increases up to a maximum of 87%.

Meanwhile, studies on a perovskite solar cell were started as a professor Miyasaka team of Japan applied methyl ammonium lead iodide that is an organic/inorganic composite material to an existing pigment adaptive solar cell in 2009, and an efficiency that was merely 3.8% then has grown rapidly, and has recorded an efficiency of 25% or more.

Although there is no high-efficiency solar cell having a high band gap that may be applied to an upper cell of a multi-junction, except for a III-V group solar cell, before development of the perovskite solar cell, studies of increasing efficiency with a tandem structure that is dually joint to an existing developed solar cell while a high-efficiency perovskite solar cell has been developed have been being actively made.

A tandem solar cell using an existing solar cell as a lower cell and a perovskite solar cell as an upper cell may be implemented.

In the tandem solar cell, one solar cell is constituted by connecting the upper cell and the lower cell in series, and a part, in which two layer are connected, is important to use the characteristics of the cell efficiently. This is a layer, in which holes generated on an upper side and electrons generated on a lower side or electrons generated on an upper side and holes generated on a lower side recombined with each other, and is also called a recombination layer.

The electrons generated on the upper side and the holes of the lower cell travel through electrodes connected to an external circuit and thus current flow. Due to a serial connection, a solar cell having high voltage characteristics may be implemented.

However, in spite that the tandem solar cell has high voltage characteristics, currents of the tandem solar cell converge to one of the upper and lower solar cells, currents of which are low, due to the serial connection of the upper solar cell and the lower solar cell.

Accordingly, a suggestion of a structure for enhancing currents of the tandem solar cell by matching the currents of the upper and lower solar cells is necessary.

To apply the tandem solar cell to actual lives, it is essential to implement a module structure, and thus it is necessary to suggest a tandem solar cell structure that is suitable for a module structure.

DETAILED DESCRIPTION OF THE INVENTION

Technical Problem

The present disclosure provides a solar cell, by which absorption of light in an upper cell may be maximized, parasite absorption of absorbing light by constituent layers other than a light absorbing layer may be minimized, absorption of light of a lower solar cell may be maximized by maximizing transmission of light of the upper cell, and optical current matching of the upper cell and a lower cell may be optimized and maximized, and a solar cell module including the same.

The present disclosure also provides a solar cell, by which optical currents and an photoelectric conversion efficiency of a multi-junction solar cell may be maximized, and a multi-junction solar cell module may be manufactured while an upper cell is not exposed to a high temperature of 200° C. to 300° C. that is essential to a module process of electrically connecting single solar cells, by changing an electrode structure, in which an electrode of one side of the solar does not corresponding to an uppermost cross-section of an upper solar cell, and a solar cell module including the same.

The technical problems that are to be solved by the present disclosure are not limited to the above-mentioned ones, and the other technical problems that have not been mentioned will be clearly understood from the following description by an ordinary person in the art, to which the present disclosure pertains.

Technical Solution

A solar cell according to an embodiment of the present disclosure includes a lower cell, a functional layer disposed on the lower cell, and an upper cell disposed on the functional layer, and the upper cell includes an upper passivation layer disposed on an upper surface of the functional layer, a transparent electrode disposed on an upper surface of the upper passivation layer, an upper first charge transport layer disposed on an upper surface of the transparent electrode, an upper electrode disposed on the upper surface of the transparent electrode to be adjacent to the upper first charge transport layer, an upper second charge transport layer disposed on the upper surface of the functional layer to be spaced apart from the upper passivation layer, the transparent electrode, the upper first charge transport layer, and the upper electrode, and an upper absorption layer disposed on the upper passivation layer, the transparent electrode, the upper first charge transport layer, and the upper second charge transport layer.

Furthermore, the upper electrode may be exposed to an outside of the upper absorption layer.

Furthermore, the upper passivation layer, the transparent electrode, the upper first charge transport layer, and the upper electrode may be disposed on the functional layer on one side thereof, and the upper second charge transport layer may be disposed on the functional layer on an opposite side thereof.

Furthermore, each of the upper passivation layer, the transparent electrode, and the upper first charge transport layer may include a body part disposed on the functional layer on the one side, and at least one extension part extending from the body part to the opposite side, and the upper second charge transport layer may include a body part disposed on the functional layer on the opposite side, and at least one extension part extending from the body part to the one side.

Furthermore, lengths of the extension parts of the upper passivation layer, the transparent electrode, and the upper first charge transport layer in a first direction and a second direction may be the same, lengths of the body parts of the upper passivation layer and the transparent electrode in the first direction may be the same, lengths of the upper passivation layer, the transparent electrode, and the upper first charge transport layer in the second direction may be the same, a length of the body part of the upper first charge transport layer in the first direction may be different from a length of the body part of the upper passivation layer, and the first direction and the second direction may be perpendicular to each other, and may be directions that are parallel to the upper surface of the functional layer.

Furthermore, the functional layer may contact the upper absorption layer in an area, in which the upper passivation layer and the upper second charge transport layer are spaced apart from each other.

Furthermore, the upper second charge transport layer may be a recombination layer.

Furthermore, the lower cell may include a lower electrode, a reflective layer disposed on an upper surface of the lower electrode, a lower passivation layer disposed on an upper surface of the reflective layer, a lower functional layer disposed on an upper surface of the lower passivation layer, and a lower absorption layer disposed on an upper surface of the lower functional layer.

Furthermore, the lower absorption layer may be a p-type semiconductor or an n-type semiconductor, and the functional layer may be an n-type semiconductor layer or a p-type semiconductor layer in correspondence to the lower absorption layer.

Furthermore, the lower absorption layer may be a silicon semiconductor, the functional layer may be a p-n junction layer, and the lower functional layer may be a back surface field (BSF).

Furthermore, the upper absorption layer may generate an electron hole pair by absorbing a middle wavelength and a short wavelength, and the lower absorption layer may generate an electron hole pair by absorbing a middle wavelength and a long wavelength.

A solar cell according to an embodiment of the present disclosure includes a lower cell, a middle cell disposed on the lower cell, and an upper cell disposed on the middle cell, and the upper cell includes an upper passivation layer disposed on an upper surface of the middle cell, a transparent electrode disposed on an upper surface of the upper passivation layer, an upper first charge transport layer disposed on an upper surface of the transparent electrode, an upper electrode disposed on the upper surface of the transparent electrode to be spaced apart from the upper first charge transport layer, an upper second charge transport layer disposed on an upper surface of the middle cell to be adjacent to the upper passivation layer, the transparent electrode, the upper first charge transport layer, and the upper electrode, and an upper absorption layer disposed on the upper passivation layer, the transparent electrode, the upper first charge transport layer, and the upper second charge transport layer.

Furthermore, the lower cell may include a lower electrode, a reflective layer disposed on an upper surface of the lower electrode, a lower passivation layer disposed on an upper surface of the reflective layer, a lower functional layer disposed on an upper surface of the lower passivation layer, and a lower absorption layer disposed on an upper surface of the lower functional layer.

Furthermore, the middle cell may include a middle first charge transport layer disposed on an upper surface of the lower absorption layer, a middle recombination layer disposed on the middle first charge transport layer, a middle second charge transport layer disposed on an upper surface of the middle recombination layer, and a middle absorption layer disposed on an upper surface of the middle second charge transport layer.

A solar cell module includes a first solar cell, and a second solar cell electrically connected onto the first solar cell, each of the first solar cell and the second solar cell includes a lower cell, a functional layer disposed on the lower cell, and an upper cell disposed on the functional cell, the upper cell includes an upper passivation layer disposed on an upper surface of the functional layer, a transparent electrode disposed on an upper surface of the upper passivation layer, an upper first charge transport layer disposed on an upper surface of the transparent electrode, an upper second charge transport layer disposed on an upper surface of the functional layer to be spaced apart from the upper passivation layer, the transparent electrode, the upper first charge transport layer, and the upper electrode, and an upper absorption layer disposed on the upper passivation layer, the transparent electrode, the upper first charge transport layer, and the upper second charge transport layer, and a portion of the lower absorption layer of the second solar cell directly contacts the transparent of the first solar cell.

Furthermore, the upper cell of the second solar cell may further include an upper electrode disposed on the upper surface of the transparent electrode to be adjacent to the upper first charge transport layer.

Furthermore, the upper adsorption layer of the upper cell of the first solar cell may be spaced apart from the second solar cell.

Advantageous Effects of the Invention

According to the embodiment of the present disclosure, absorption of light in an upper cell may be maximized, parasite absorption of absorbing light by constituent layers other than a light absorbing layer may be minimized, absorption of light of a rear solar cell may be maximized by maximizing transmission of light of the upper cell, and optical current matching of the upper cell and a lower cell may be optimized and maximized.

Furthermore, according to the embodiment of the present disclosure, optical currents and an photoelectric conversion efficiency of a multi-junction solar cell may be maximized, and a multi-junction solar cell module may be manufactured while an upper cell is not exposed to a high temperature of 200° C. to 300° C. that is essential to a module process of electrically connecting single solar cells, by changing an electrode structure, in which an electrode of one side of the solar does not corresponding to an uppermost cross-section of an upper solar cell.

The advantageous effects of the present disclosure are not limited to the above-mentioned ones, and the other advantageous effects will be clearly understood by an ordinary person skilled in the art to which the present disclosure pertains.

BEST MODE

Figure 1:
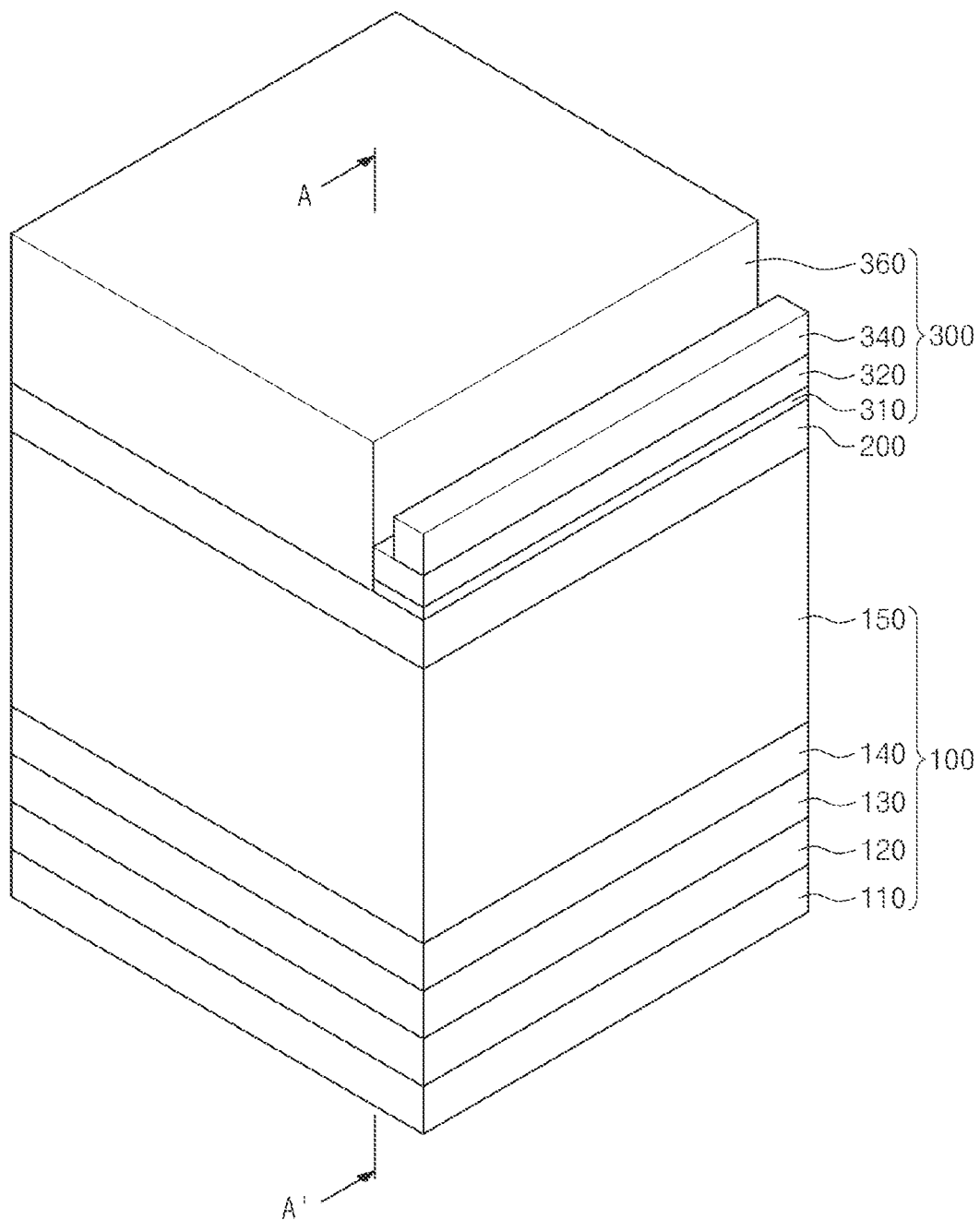
FIG. 1 is a perspective view illustrating a solar cell according to an embodiment of the present disclosure.

Hereinafter, embodiments of the present disclosure will be described in detail with reference to the accompanying drawings. The embodiments of the present disclosure may be modified in various forms, and the scope of the present disclosure should not be construed to be limited to the following embodiments. The embodiments of the present disclosure are provided to describe the present invention for those skilled in the art more completely. Accordingly, the shapes of the components of the drawings are exaggerated to emphasize clearer description thereof.

The configurations of the present disclosure for clearly describing a solution for the problem that is to be solved by the present disclosure will be described in detail with reference to the accompanying drawings based on a preferred embodiment of the present disclosure, in which the same reference numerals are given for the same elements in denoting the reference numerals for the elements even though they are present in different drawings, and when a drawing has to be referenced for a description of the embodiment, the elements in another drawing also may be cited.

Figure 2:
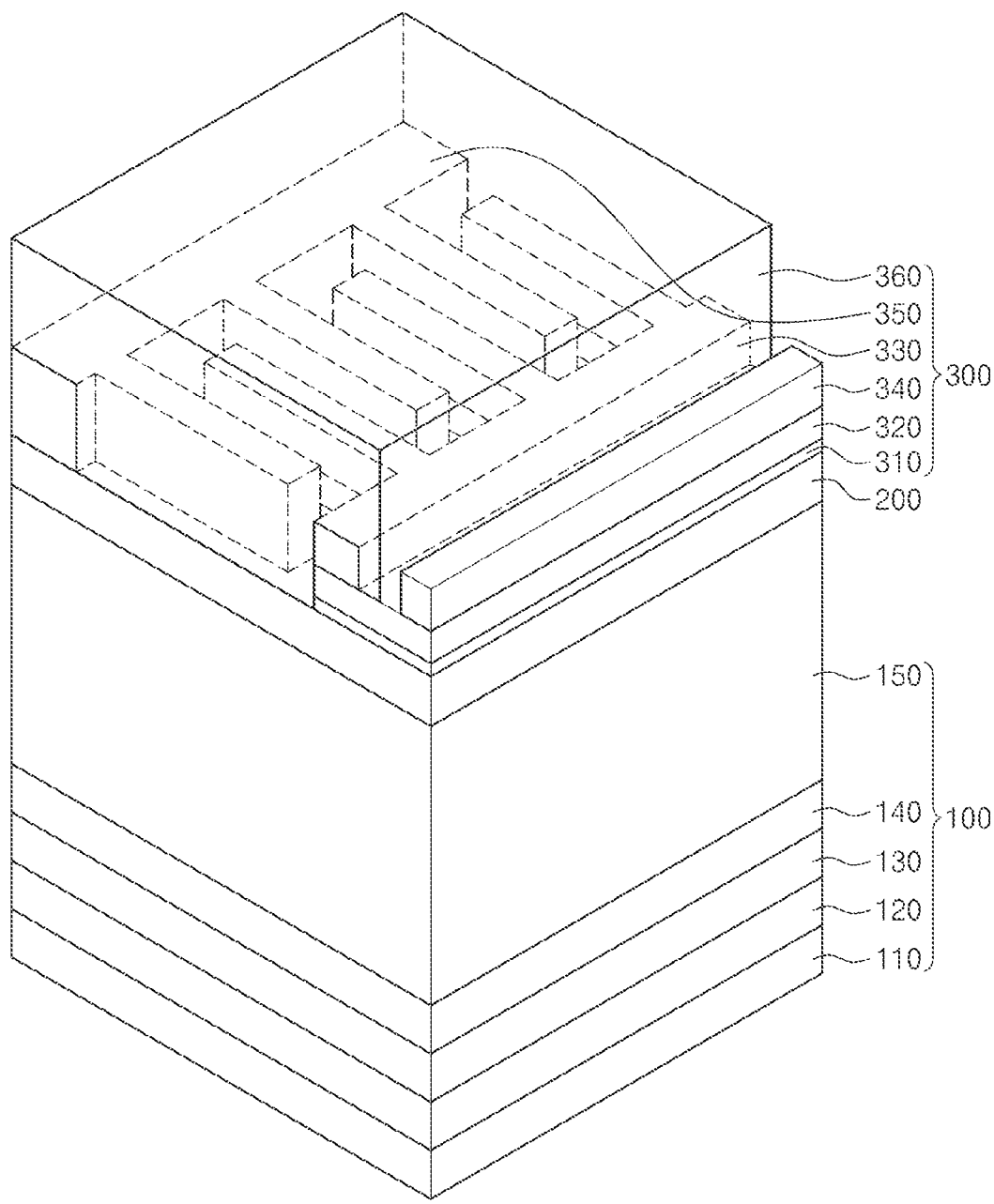
FIG. 2 is a perspective view transparently expressing an upper absorption layer in FIG. 1.
Figure 3:
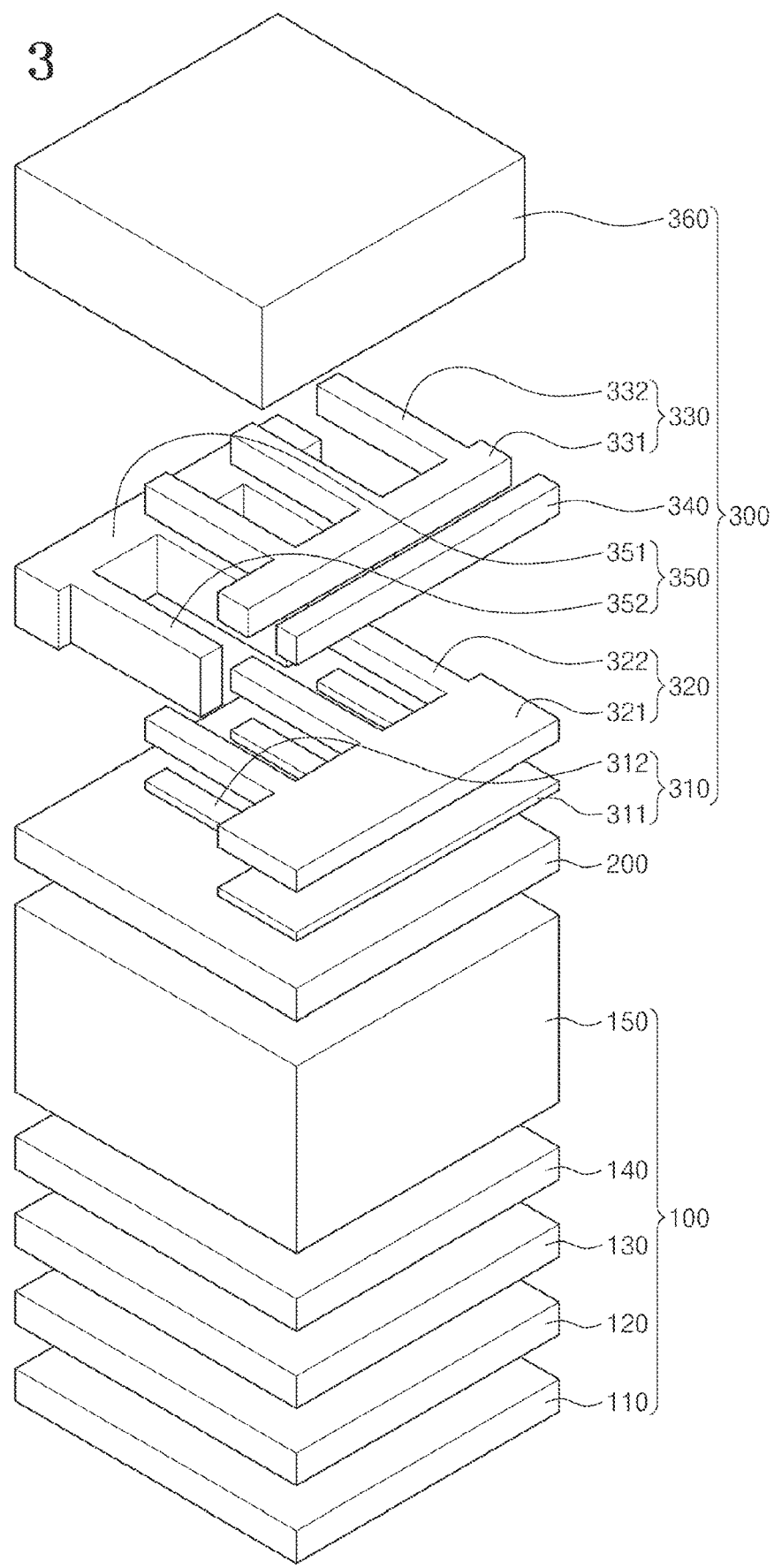
FIG. 3 is an exploded perspective view of a solar cell according to an embodiment of the present disclosure.
Figure 4:
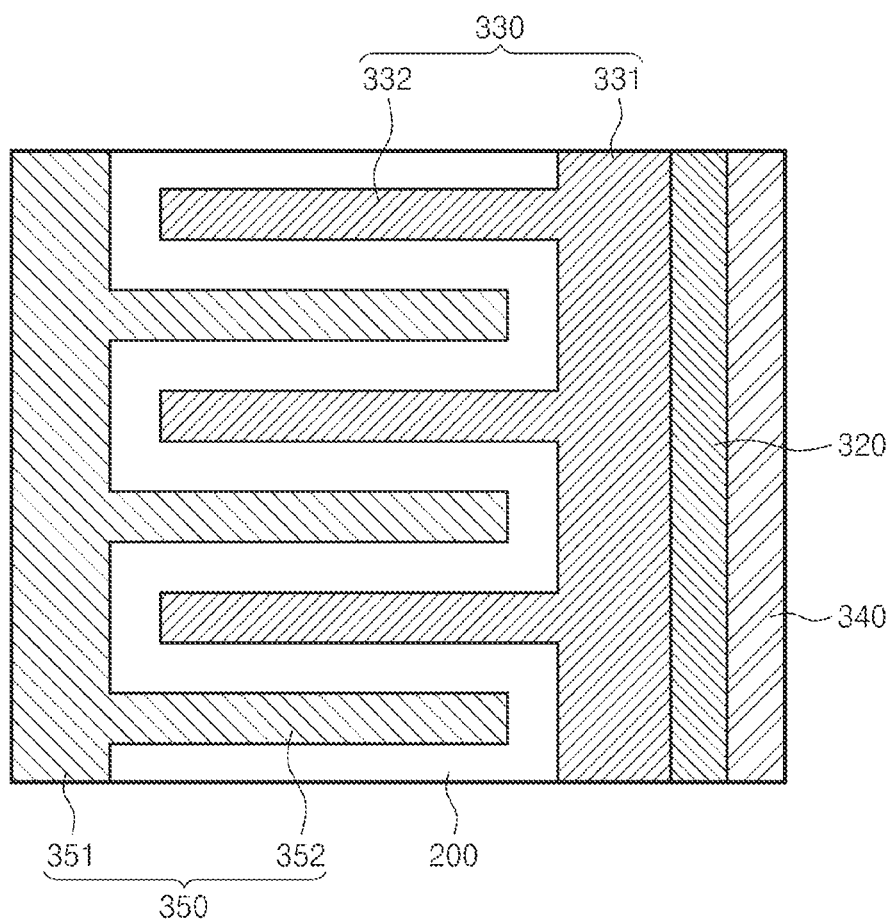
FIG. 4 is a top view, in which an upper absorption layer is removed from a solar cell according to an embodiment of the present disclosure.
Figure 5:
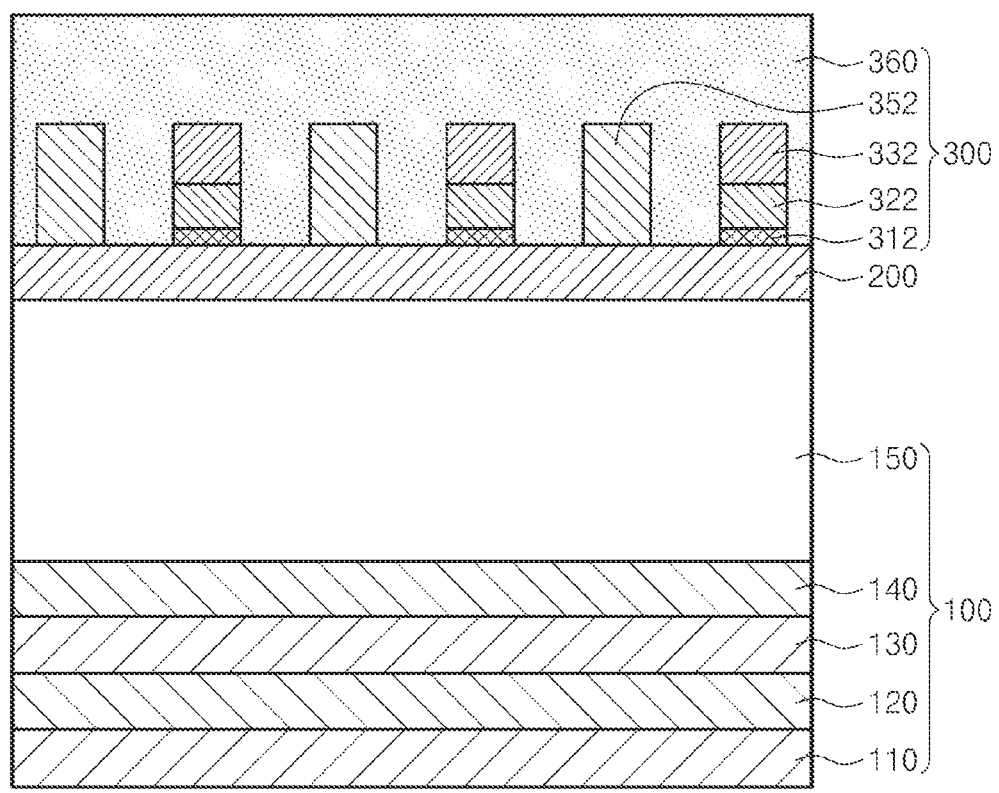
FIG. 5 is a cross-sectional view of line A-A' of FIG. 1.
Figure 6:
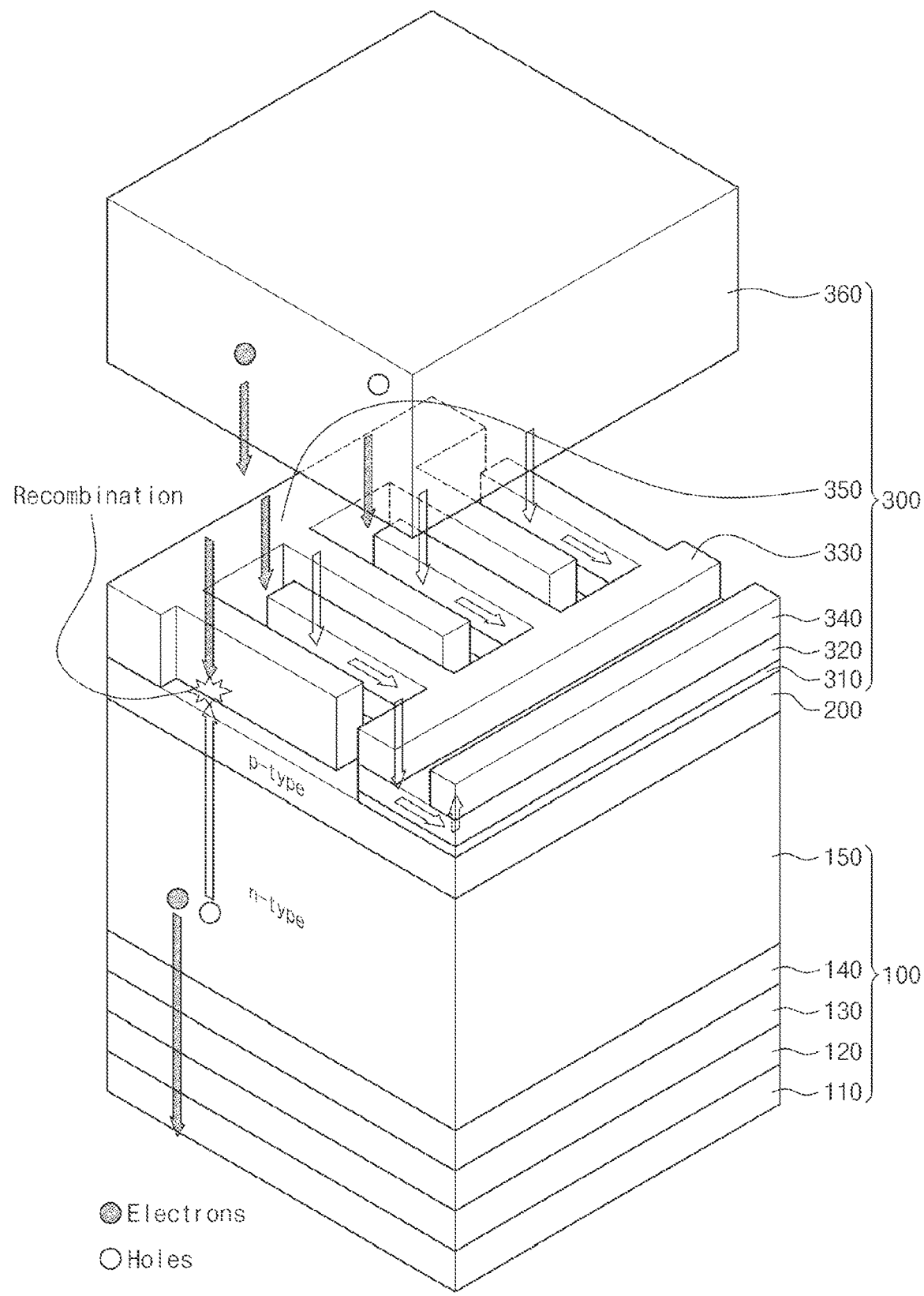
FIGS. 6 and 7 are exemplary views illustrating travel paths of electrons and holes in a solar cell according to an embodiment of the present disclosure.
Figure 7:
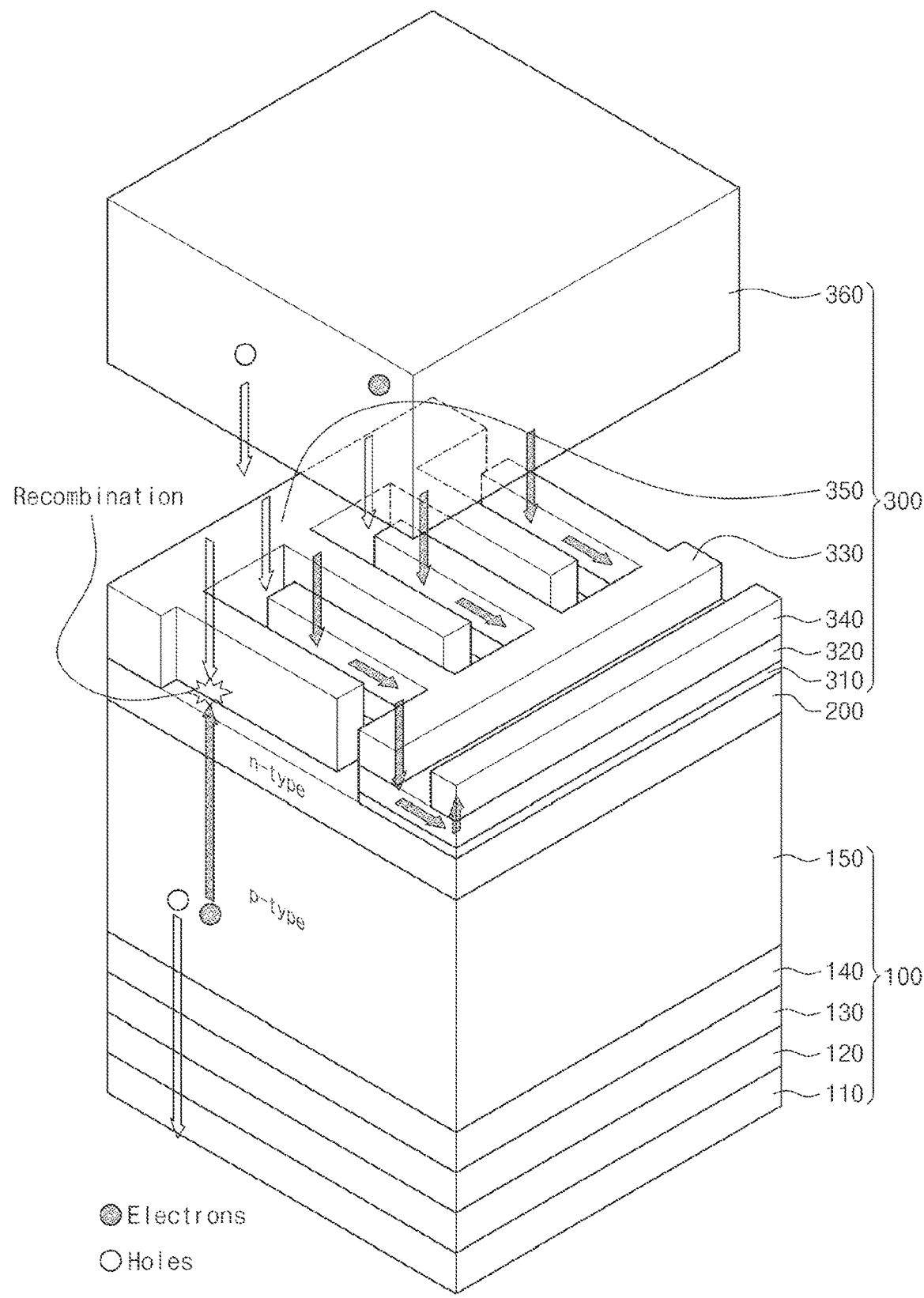
Figure 8:
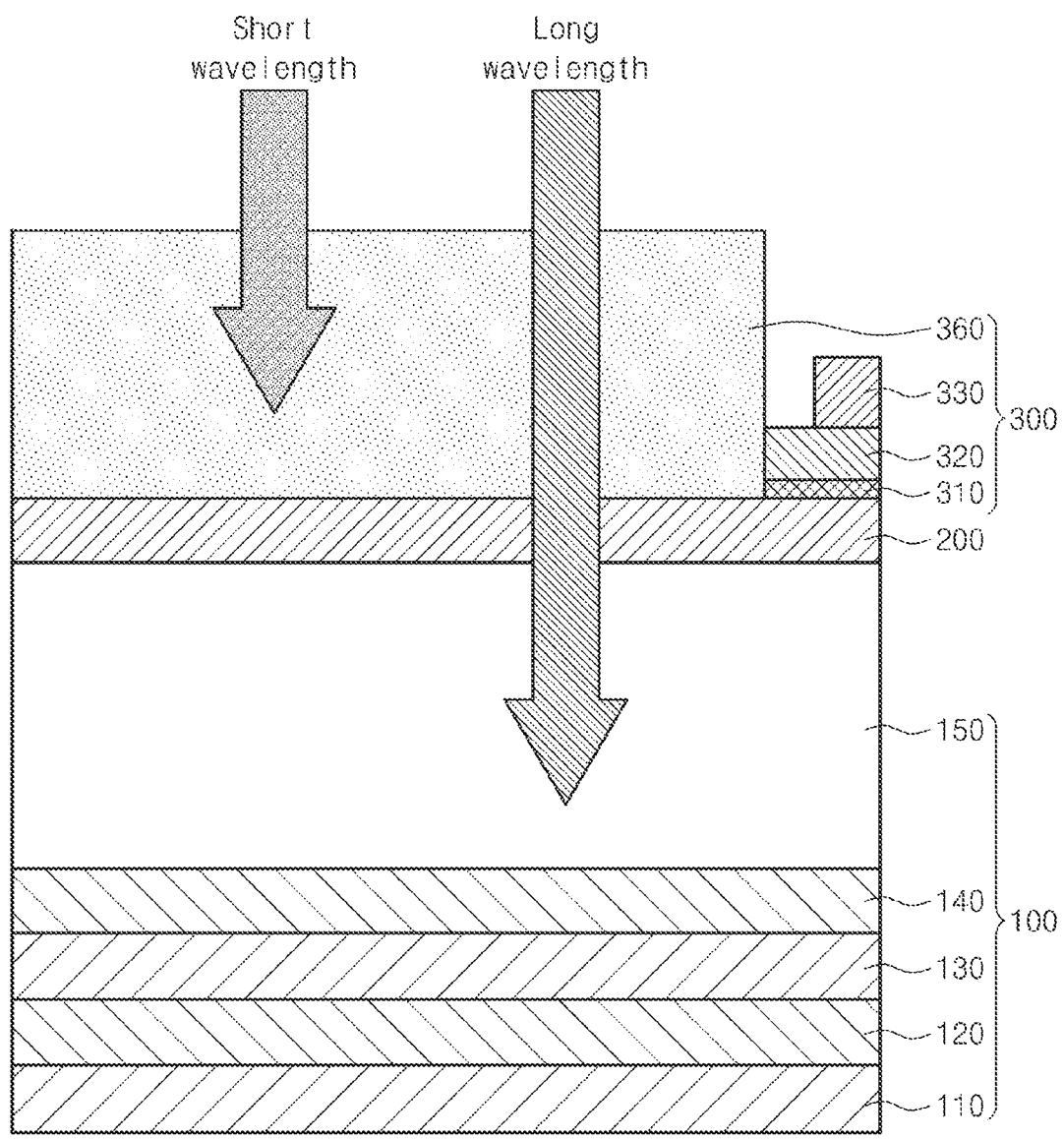
FIG. 8 is an exemplary view illustrating travel paths of light according to wavelengths in a solar cell according to an embodiment of the present disclosure.

FIG. 1 is a perspective view illustrating a solar cell according to an embodiment of the present disclosure. FIG. 2 is a perspective view transparently expressing an upper absorption layer in FIG. 1. FIG. 3 is an exploded perspective view of the solar cell according to the embodiment of the present disclosure. FIG. 4 is a top view, in which the upper absorption layer is removed from the solar cell according to the embodiment of the present disclosure. FIG. 5 is a cross-sectional view of line A-A' of FIG. 1. FIGS. 6 and 7 are exemplary views illustrating travel paths of electrons and holes in the solar cell according to the embodiment of the present disclosure. FIG. 8 is an exemplary view illustrating travel paths of light according to wavelengths in the solar cell according to the embodiment of the present disclosure.

First, referring to FIGS. 1 to 4, a solar cell according to an embodiment of the present disclosure may include a lower cell 100, a functional layer 200, and an upper cell 300.

Here, the solar cell according to the embodiment of the present disclosure has a two-terminal tandem solar cell, in which the silicon solar cell 100 including an absorption layer having a relatively small band gap and the perovskite solar cell 300 including an absorption layer having a relatively large band gap are directly joined with a recombination layer by a medium of the functional layer 200.

Accordingly, among light input to the solar cell according to an embodiment of the present disclosure, light of a short wavelength area is absorbed by the perovskite solar cell disposed at an upper portion thereof or the solar cell 300 of another organic material, an inorganic material, or a mixture of an organic material and an inorganic material to generate charges, and light of a long wavelength area that passes through the perovskite solar cell 300 is absorbed by a silicon solar cell disposed at a lower portion thereof or the solar cell 100 of another organic material, an inorganic material, or a mixture of an organic material and an inorganic material to generate charges.

The solar cell according to the embodiment of the present disclosure, which has the above-described structure, absorbs light of middle wavelength and short wavelength areas from the perovskite solar cell 300 disposed at an upper portion thereof to generate a power, and absorbs light of middle wavelength and long wavelength areas at the silicon solar cell 100 disposed at a lower portion thereof to generate a power, and as a result, a wavelength band absorbed by all the solar cells may be widened.

Meanwhile, the lower cell 100 may be implemented by a heterojunction silicon solar cell, a homojunction silicon solar cell, or a solar cell of an organic material, an inorganic material, and a mixture of an organic material and an inorganic material.

The lower cell 100 may include a lower electrode 110, a reflective layer 120, a lower passivation layer 130, a lower functional layer 140, and a lower absorption layer 150.

Meanwhile, although not illustrated, a texture having a convexo-concave structure may be formed in at least one of the lower electrode 110, the reflective layer 120, the lower passivation layer 130, the lower functional layer 140, and the lower absorption layer 150.

The lower electrode 110 may be formed of a metal or a metal alloy. The lower electrode 110 may include at least one material selected from molybdenum (Mo), aluminum (Al), silver (Ag), gold (Au), platinum (Pt), copper (Cu), nickel (Ni), and carbon (C).

Meanwhile, the lower electrode 110 may perform a function of reflecting light input to an upper portion thereof to prevent the light from being leaked to an outside.

Furthermore, the lower electrode 110 may collect holes or electrons.

The reflective layer 120 may be disposed directly on an upper surface of the lower electrode 110, and functions to increase photoelectric conversion efficiency by causing light input to an upper portion thereof to increase a path.

The lower passivation layer 130 may be formed of a light transmitting insulation film, and an oxide film-based or nitride film-based insulating film may be used.

The lower functional layer 140 may function to return specific charges to an absorption layer or function as an electron transport layer or a hole transport layer according to a semiconductor type of the lower absorption layer 150.

When the lower functional layer 140 is a hole transport layer, the hole transport layer may be poly(3,4-ethylenedioxythiophene):poly(styrenesulfonate) (PEDOT:PSS), polyhiophenylenevinylene, polyvinylcarbazole, poly-p-phenylenevinylene, and a derivative thereof. However, the present disclosure is not limited thereto, and various forms of organic materials may be used. Furthermore, molybdenum oxide, vanadium oxide, tungsten oxide, and the like that are metal oxide semiconductors doped with a p-type may be used.

Furthermore, when the lower functional layer 140 is an electron transport layer, the electron transport layer may be PCBM([6,6]-phenyl-C61 butyric acid methyl ester)(PCBM (C60), PCBM(C70), PCBM(C80)) that is fullerene (C60, C70, C80) or a fullerene derivative. However, the present disclosure is not limited thereto, and various forms of organic materials may be used. Furthermore, titanium oxide (TiOx), zinc oxide (ZnO), and the like that are metal oxide semiconductors doped with an n-type may be used.

Meanwhile, when the lower cell 100 is a silicon-based solar cell, the lower functional layer 140 may function as a back surface field (BSF) for increasing a charge collection possibility by forming an electric field on a rear surface of the lower absorption layer 150.

The lower absorption layer 150, for example, may include amorphous silicon, fine crystal silicon, amorphous silicon germanium, fine crystal silicon germanium, an organic material, and a mixture of an organic material and an inorganic material.

The lower absorption layer 150 may have an energy band gap that is smaller than that of an upper absorption layer 360 of the upper cell 300, and may absorb light of a middle wavelength and a long wavelength.

Here, a wavelength band of a middle wavelength may be 500 nm to 900 nm, and a wavelength band of a long wavelength may be 700 nm to 1,200 nm.

The lower absorption layer 150 may form an electron hole pair in an excitation state, that is, exitons while absorbing light of a long wavelength, which is irradiated to the solar cell The functional layer 200 may be disposed on the lower cell 100, and may be disposed on an upper surface of the lower absorption layer 150.

That is, the functional layer 200 may be disposed between the lower cell 100 and the upper cell 300.

The functional layer 200 may function as a p-n junction layer when the lower cell 100 is a silicon-based solar cell, and may function as a charge transport layer when the lower cell 100 is a solar cell other than a silicon-based solar cell.

Here, the p-n junction layer functions to separate an electron hole pair generated in the lower cell 100, and functions to decrease an interface resistance.

Constituent materials of the p-n junction layer may include one or two or more selected from a group consisting of a metal oxide, a metal, a conductive polymer, a dielectric material, and a carbon compound.

In detail, the functional layer 200 may form a junction layer of ZnO/PEDOT:PSS, and may form the junction layer by doping an n-type or p-type material.

The upper cell 300 may be disposed on the functional layer 200, and may be implemented by the perovskite solar cell.

The upper cell 300 may include an upper passivation layer 310, a transparent electrode 320, an upper first charge transport layer 330, an upper electrode 340, an upper second charge transport layer 350, and the upper absorption layer 360.

Furthermore, although not illustrated, a passivation layer and a reflection preventing film may be included on the upper absorption layer.

The upper passivation layer 310 may be disposed on the functional layer 200, may be formed of a light transmitting insulation film, and an oxide film-based or nitride film-based insulating film may be used.

The upper passivation layer 310 may be disposed on the functional layer 200 on one side thereof.

Here, the one side of the functional layer 200 may be one side, on which the upper electrode 340 is disposed but the upper absorption layer 360 is not disposed such that the upper electrode 340 is exposed to an outside.

The upper passivation layer 310 may include a body part 311 disposed on the functional layer 200 at one end thereof, and a plurality of extension parts 312 that extend from the body part 311 to an opposite side.

The transparent electrode 320 may be preferably disposed on an entire surface of the upper passivation layer 310, and may include a body part 321 disposed on the functional layer 200 at one end thereof, and a plurality of extension parts 322 that extend from the body part 321 to an opposite side.

Here, it is preferable that the transparent electrode 320 has a shape and an area that are the same as those of the upper passivation layer 310.

In detail, it is preferable that the body part 311 of the upper passivation layer 310 and the body part 321 of the transparent electrode 320 have the same lengths in a first direction and a second direction to have the same shape and the same area.

Here, the first direction may be defined as a direction that connects one side and an opposite side, the second direction may be defined as a direction that is perpendicular to the first direction, and the first direction and the second direction may be defined as directions that are parallel to an upper surface of the functional layer 200.

Furthermore, it is preferable that the extension parts 312 of the upper passivation layer 310 and the extension parts 322 of the transparent electrode 320 have the same lengths in the first direction and the second direction to have the same shape and the same area.

Meanwhile, the transparent electrode 320 may be formed of a transparent conductive layer by using materials, such as zinc oxide (ZnO), indium tin oxide (ITO), and aluminum-doped zinc oxide (AZO).

The upper first charge transport layer 330 may be preferably disposed on an entire surface of the upper transparent electrode 320, and may include a body part 331 disposed on the functional layer 200 at one end thereof, and a plurality of extension parts 332 that extend from the body part 331 to an opposite side.

Here, it is preferable that the upper first charge transport layer 330 has a shape and an area that are partially different from those of the upper passivation layer 310 and the transparent electrode 320.

In detail, lengths of the body part 331 of the upper first charge transport layer 330 and the body part 321 of the transparent electrode 320 may be different in the first direction, and may be the same in the second direction.

Meanwhile, it is preferable that the extension parts 332 of the upper first charge transport layer 330 and the extension part 322 of the transparent electrode 320 have the same lengths in the first direction and the second direction to have the same shape and the same area.

Here, the upper electrode 340 may be disposed on the body part 321 of the transparent electrode 320 in an area, in which the body part 331 of the upper first charge transport layer 330 is not disposed.

The upper first charge transport layer 330 may function as an electron transport layer or a hole transport layer according to a semiconductor type of the upper absorption layer 360.

When the upper first charge transport layer 330 is a hole transport layer, the upper first charge transport layer 330 may be poly(3,4-ethylenedioxythiophene):poly(styrene-sulfonate) (PEDOT:PSS), polyhiophenylenevinylene, poly-vinylcarbazole, poly-p-phenylenevinylene, poly(3-hexylthi-ophene-2,5-diyl) (P3HT), poly[bis(4-phenyl)(2,4,6-trimethylphenyl)amine] (PTAA), 9'-spirobi[9H-fluorene]-2,2',7,7"-tetramine (Spiro-MeOTAD), and a derivative thereof. However, the present disclosure is not limited thereto, and various forms of organic materials may be used. Furthermore, molybdenum oxide, vanadium oxide, tungsten oxide, nickel oxide, and the like that are metal oxide semiconductors doped with a p-type may be used.

Furthermore, when the upper first charge transport layer 330 is an electron transport layer, the electron transport layer may be PCBM([6,6]-phenyl-C61 butyric acid methyl ester) (PCBM(C60), PCBM(C70), PCBM(C80)) that is fullerene (C60, C70, C80) or a fullerene derivative. However, the present disclosure is not limited thereto, and various forms of organic materials may be used. Furthermore, titanium oxide (TiOx), zinc oxide (ZnO), tin oxide (SnOx), and the like that are metal oxide semiconductors doped with a n-type may be used.

As described above, the upper electrode 340 may be disposed on the body part 321 of the transparent electrode 320, and may be disposed on the body part 321 of the transparent electrode 320 to be or not to be spaced apart from the upper first charge transport layer 330.

Here, the upper electrode 340 may not be covered by the upper absorption layer 360, and may be exposed to an outside to provide an electrical connection path.

That is, because a multi-junction solar cell module may be manufactured while the upper cell is not exposed to a high temperature of 200° C. to 300° C. that is essential to a module process of electrically connecting single solar cells, by disposing the upper electrode 340 not on an uppermost cross-section of the upper solar cell but on one side of the solar cell, thermal damage to the upper cell may be prevented.

The upper electrode 340 may be formed of a metal or a metal alloy. The upper electrode 340 may include at least one material selected from molybdenum (Mo), aluminum (Al), silver (Ag), gold (Au), platinum (Pt), copper (Cu), carbon (C), and nickel (Ni).

The upper second charge transport layer 350 may be disposed on the functional layer 200, and may be disposed on the functional layer 200 on the opposite side.

Here, the opposite side of the functional layer 200 may be defined as an opposite side to the one side in the first direction.

The upper second charge transport layer 350 may include a body part 351 disposed on the functional layer 200 at an opposite end thereof, and a plurality of extension parts 352 that extend from the body part 351 to the one side.

Here, the body part 351 and the extension parts 352 of the upper second charge transport layer 350 may be spaced apart from the upper passivation layer 310, the transparent electrode 320, and the upper first charge transport layer 330.

In an area, in which the upper second charge transport layer 350 is spaced apart from the upper passivation layer 310, the transparent electrode 320, and the upper first charge transport layer 330, the functional layer 200 may directly contact the upper absorption layer 360.

Here, through the area, in which the upper second charge transport layer 350 is spaced apart from the upper passivation layer 310, the transparent electrode 320, and the upper first charge transport layer 330, light of a long wavelength may be delivered to the lower absorption layer 150 without reflection, absorption of parasites, or refraction, whereby photoelectric conversion efficiency may be maximized.

Here, referring to FIG. 5 together, in the second direction, the extension parts 352 of the upper second charge transport layer 350 may be arranged alternately with the extension parts 312, 322, and 332 of the upper passivation layer 310, the transparent electrode 320, and the upper first charge transport layer 330.

The upper second charge transport layer 350 may function as an electron transport layer or a hole transport layer according to a semiconductor type of the upper absorption layer 360.

When the upper second charge transport layer 350 is a hole transport layer, this kind of the hold transport layer may be poly(3,4-ethylenedioxythiophene):poly(styrenesulfonate) (PEDOT:PSS), polyhiophenylenevinylene, polyvinylcarbazole, poly-p-phenylenevinylene, poly(3-hexylthiophene-2,5-diyl) (P3HT), poly[bis(4-phenyl)(2,4,6-trimethylphenyl)amine] (PTAA), 9'-spirobi[9H-fluorene]-2, 2',7,7"-tetramine (Spiro-MeOTAD), and a derivative thereof. However, the present disclosure is not limited thereto, and various forms of organic materials may be used. Furthermore, molybdenum oxide, vanadium oxide, tungsten oxide, nickel oxide, and the like that are metal oxide semiconductors doped with a p-type may be used.

Furthermore, when the upper second charge transport layer 350 is an electron transport layer, the electron transport layer may be PCBM([6,6]-phenyl-C61 butyric acid methyl ester)(PCBM(C60), PCBM(C70), PCBM(C80)) that is fullerene (C60, C70, C80) or a fullerene derivative. However, the present disclosure is not limited thereto, and various forms of organic materials may be used. Furthermore, titanium oxide (TiOx), tin oxide (SnOx), zinc oxide (ZnO), and the like that are metal oxide semiconductors doped with an n-type may be used.

Meanwhile, the upper second charge transport layer 350 may perform a recombination layer function of causing electrons (holes) delivered from the lower absorption layer 150 and holes (electrons) delivered from the upper absorption layer 360 to meet each other for recombination thereof.

That is, in the upper second charge transport layer 350, electrons of the lower absorption layer 150 and holes of the upper absorption layer 360, or holes of the lower absorption layer 150 and electrons of the upper absorption layer 360 meet each other for recombination thereof.

Here, it is preferable that the upper second charge transport layer 350 is formed on the functional layer through spin coating, deep coating, drop casting, inkjet printing, screen printing, or thermal deposition, by using an organic or inorganic material having conductivity.

Meanwhile, the organic or inorganic material that may be used for the upper second charge transport layer 350 may be a conductive metal such as gold or silver, metal nano particles, a metal oxide, or a conductive polymer. It is preferable that the conductive polymer is one or more selected from a group consisting of poly(3,4-ethylenedioxythiophene)-poly(styrenesulfonate) (PEDOT:PSS), polyaniline, and polypyrrole.

The upper absorption layer 360 may have an energy band gap that is larger than that of the lower absorption layer 150 of the lower cell 100, and may absorb light of a middle wavelength and a short wavelength.

Here, a wavelength band of a middle wavelength may be 500 nm to 900 nm, and a wavelength band of a short wavelength may be 300 nm to 700 nm.

The upper absorption layer 360 may form an electron-hole pair in an excitation state, that is, exitons while absorbing light of a short wavelength, which is irradiated to the solar cell.

Here, the upper absorption layer 360 may include a solar cell including a perovskites compound, or an organic material, an inorganic material, or a mixture of an organic material and an inorganic material as a photokinesis material, or a solar cell including an organic material, an inorganic material, or a mixture of an organic material and an inorganic material. The perovskites compound has a direct band gap, has a high light absorption coefficient of about 550 nm to $1.5 \times 10^{-4}$ cm, has excellent charge travel characteristics, and has an excellent resistance to a defect.

Furthermore, the perovskites compound may from a light absorption material that forms a photokinesis layer through an extremely simple, easy, and inexpensive simple process of application and drying of a solution, may form a light absorption material of rough crystal grains as it is voluntarily crystalized through the drying of the applied solution, and in particular, has an excellent conductivity for both of electrons and holes.

The perovskites compound may be expressed in a chemical formula of $ABX_3$ (A is formamidinium that has an alkyl group of C1 to C20, a monovalent metal (for example, Li, Na, CS, Rb, and the like), monovalent ammonium ions, or a resonance structure, B is divalent metal ions, and X is halogen ions).

Hereinafter, a solar cell according to another embodiment of the present disclosure will be described with reference to FIG. 9.

Figure 9:
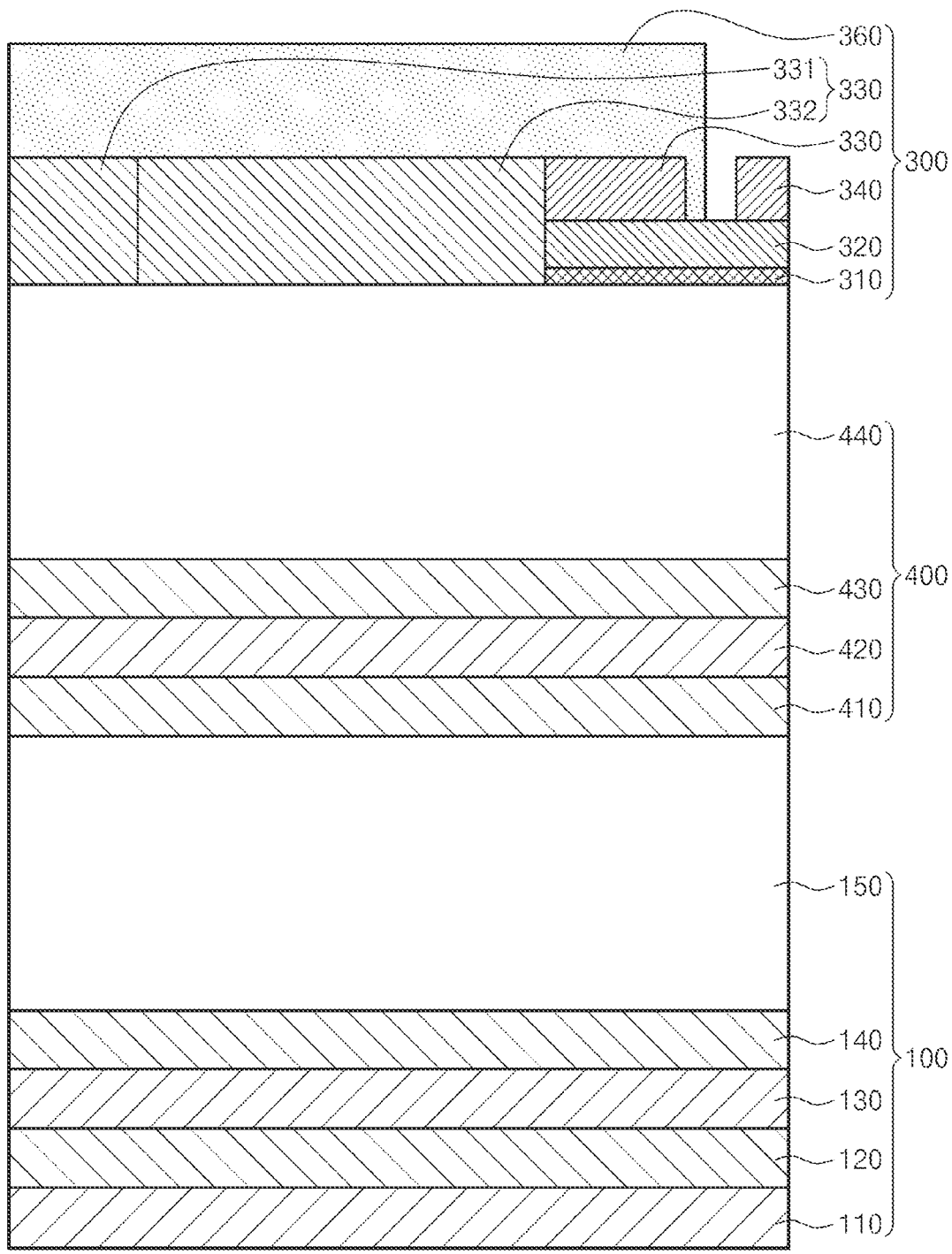
FIG. 9 is a cross-sectional view illustrating a solar cell according to another embodiment of the present disclosure.

FIG. 9 is a cross-sectional view illustrating a solar cell according to another embodiment of the present disclosure.

Referring to FIG. 9, because a solar cell according to another embodiment of the present disclosure has a middle cell 400 that is different from that of the solar cell according to the embodiment of the present disclosure illustrated in FIGS. 1 to 8, only different configurations of the middle cell 400 will be described in detail hereinafter, and a detailed description of the repeated reference numerals of the same configurations will be omitted.

The solar cell according to the another embodiment of the present disclosure may include the lower cell 100, the upper cell 300, and the middle cell 400.

The middle cell 400 may be disposed between the lower cell 100 and the upper cell 300.

Here, although not illustrated, a plurality of middle cells 400 may be provided, and the plurality of middle cells 400 may absorb light of specific wavelength areas.

Accordingly, among lights input to the solar cell according to the another embodiment of the present disclosure, light of a short wavelength area may be absorbed by the perovskites solar cell 300 disposed on an upper side to generate charges, light of a long wavelength area that passes through the perovskites solar cell 300 may be absorbed by the silicon solar cell 100 disposed on a lower side to generate charges, and the middle cell 400 may absorb wavelengths of a middle area of the wavelength areas absorbed by the perovskites solar cell 300 and the silicon solar cell 100.

The above-structured solar cell according to the another embodiment of the present disclosure may include the lower cell 100, the upper cell 300, and the middle cell 400, and thus a wavelength band absorbed by all the solar cells may be widened.

Here, although not illustrated, a plurality of middle cells 400 may be provided, and the plurality of middle cells 400 may absorb light of specific wavelength areas. That is, because the wavelength band absorbed by all the solar cells may be widened in a wide range, photoelectric conversion efficiency may be maximized.

The middle cell 400 may include a middle first charge transport layer 410, a recombination layer 420, a middle second charge transport layer 430, and a middle absorption layer 440.

The middle first charge transport layer 410 may be disposed on an upper surface of the lower absorption layer 150, and may deliver holes and electrons.

That is, the middle first charge transport layer 410 may function as an electron transport layer or a hole transport layer according to semiconductor types of the lower absorption layer 150, the upper absorption layer 360, and the middle absorption layer 440.

In the recombination layer 420, electrons of the lower absorption layer 150 and holes of the middle absorption layer 440 or holes of the lower absorption layer 150 and electrons of the middle absorption layer 440 may meet each other for recombination.

The middle second charge transport layer 430 may be disposed on an upper surface of the recombination layer 420, and may deliver holes and electrons.

That is, the middle second charge transport layer 430 may function as an electron transport layer or a hole transport layer according to semiconductor types of the lower absorption layer 150, the upper absorption layer 360, and the middle absorption layer 440.

The middle absorption layer 440 may absorb light having a middle wavelength that is an area between light of a long wavelength area absorbed by the lower absorption layer 150 and light of a short wavelength area absorbed by the upper absorption layer 360.

That is, the middle absorption layer 440 may form an electron-hole pair in an excitation state, that is, exitons while absorbing light of a middle wavelength, which is irradiated to the solar cell.

Through this, a wavelength band absorbed by all the solar cells may be widened, and a voltage of all the solar cells may be increased.

Hereinafter, a solar cell module according to another embodiment of the present disclosure will be described with reference to FIG. 10.

Figure 10:
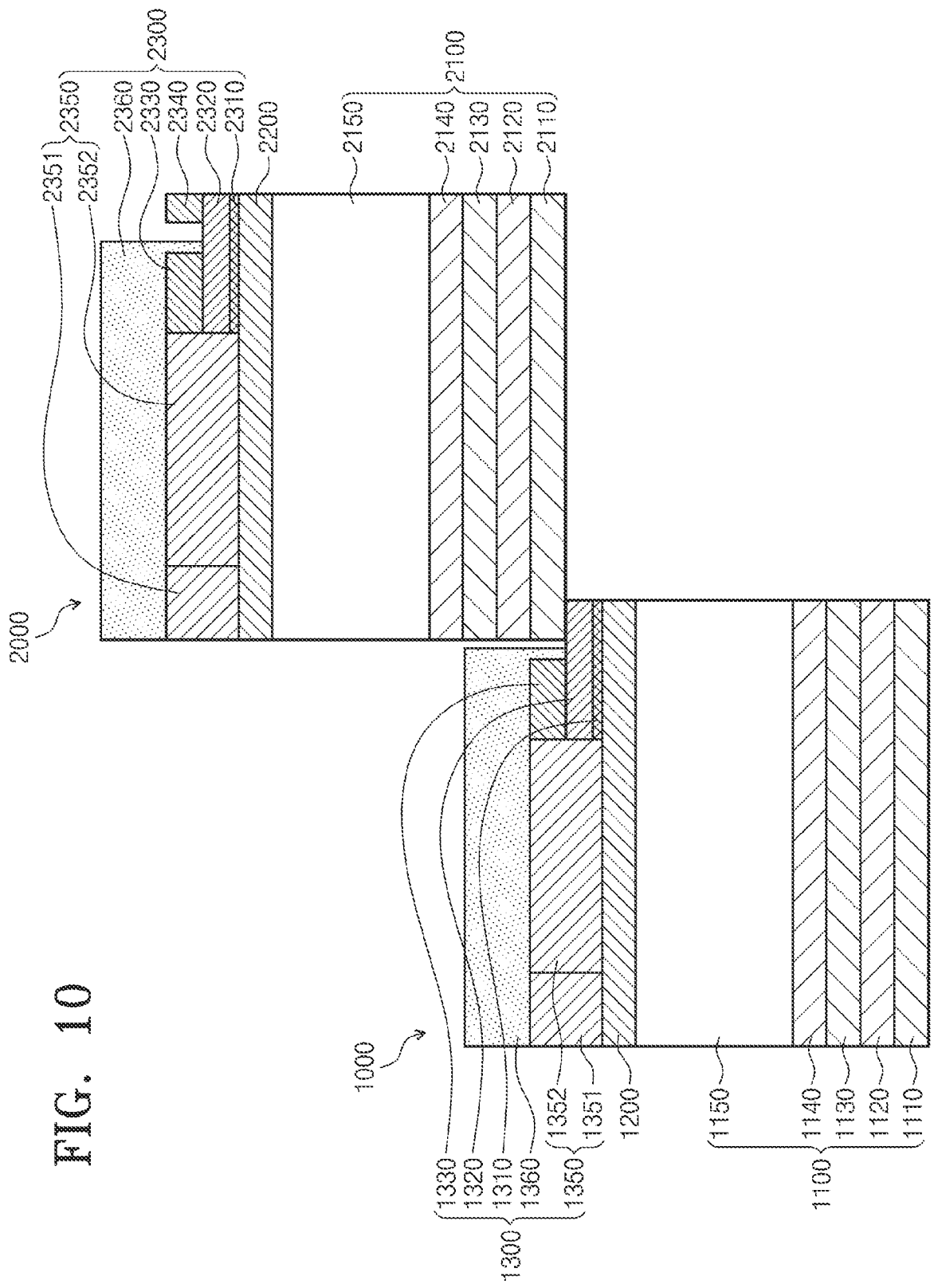
FIG. 10 is a cross-sectional view illustrating a solar cell module according to another embodiment of the present disclosure.

FIG. 10 is a cross-sectional view illustrating a solar cell module according to another embodiment of the present disclosure.

Referring to FIG. 10, the solar cell module according to another embodiment of the present disclosure has a configuration, in which a pair of solar cells 1000 and 2000 according to the embodiment of the present disclosure, which are illustrated in FIGS. 1 to 8, are electrically connected to each other, and thus a detailed description of the configuration of the solar cells 1000 and 2000 will be omitted hereinafter.

The solar cell module according to the another embodiment of the present disclosure may be constituted by electrically connecting the first solar cell 1000 and the second solar cell 2000.

Meanwhile, as illustrated in FIG. 10, the first solar cell 1000 and the second solar cell 2000 may be stacked not to be aligned. Through this, because the light input from an upper side may reach the first solar cell 1000 while being neither refracted nor hindered by the second solar cell 2000, photoelectric conversion efficiency may be maximized.

Here, the first solar cell 1000 may include a lower cell 1100, a functional layer 1200, and an upper cell 1300.

Furthermore, the lower cell 1100 may include a lower electrode 1110, a reflective layer 1120, a lower passivation layer 1130, a lower functional layer 1140, and a lower absorption layer 1150.

Furthermore, the upper cell 1300 may include an upper passivation layer 1310, a transparent electrode 1320, an upper first charge transport layer 1330, a second charge transport layer 1350, and an upper absorption layer 1360.

Furthermore, the second solar cell 2000 may include a lower cell 2100, a functional layer 2200, and an upper cell 2300.

Furthermore, the lower cell 2100 may include a lower electrode 2110, a reflective layer 2120, a lower passivation layer 2130, a lower functional layer 2140, and a lower absorption layer 2150.

Furthermore, the upper cell 2300 may include an upper passivation layer 2310, a transparent electrode 2320, an upper first charge transport layer 2330, an upper electrode 2340, a upper second charge transport layer 2350, and an upper absorption layer 2360.

Meanwhile, the lower electrode 2110 of the second solar cell 2000 may be electrically and physically connected to the transparent electrode 1320 of the first solar cell 1000.

Meanwhile, although not illustrated, the upper electrode (not illustrated) may be disposed on the transparent electrode 1320, and the lower electrode 2110 of the second solar cell 2000 may be electrically and physically connected to the upper electrode of the first solar cell 1000.

Here, the lower electrode 2110 of the second solar cell 2000 is disposed to be physically spaced apart from the upper first charge transport layer 1330, the upper second charge transport layer 1350, and the upper absorption layer 1360 of the first solar cell 1000.

Meanwhile, although not illustrated, the upper electrode 2340 may be removed from the second solar cell 2000, and a third solar cell (not illustrated) electrically and physically connected to the transparent electrode 2320 may be disposed.

The above detailed description exemplifies the present disclosure. Furthermore, the above-mentioned contents describe the exemplary embodiment of the present disclosure, and the present disclosure may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the present disclosure, and various changes required in the detailed application fields and purposes of the present disclosure can be made. Accordingly, the detailed description of the present disclosure is not intended to restrict the present invention in the disclosed embodiment state. Furthermore, it should be construed that the attached claims include other embodiments.

DESCRIPTION OF REFERENCE NUMERALS

100: lower cell
200: functional layer
300: upper cell

The invention claimed is:
1. A solar cell comprising:
a lower cell;
a functional layer (200) disposed on the lower cell; and
an upper cell disposed on the functional layer,
wherein the upper cell includes:
an upper passivation layer disposed on an upper surface of the functional layer;
a transparent electrode disposed on an upper surface of the upper passivation layer;
an upper first charge transport layer disposed on an upper surface of the transparent electrode;

an upper electrode disposed on the upper surface of the transparent electrode to be adjacent to the upper first charge transport layer;

an upper second charge transport layer disposed on the upper surface of the functional layer to be spaced apart from the upper passivation layer, the transparent electrode, the upper first charge transport layer, and the upper electrode; and an upper absorption layer disposed on the upper passivation layer, the transparent electrode, the upper first charge transport layer, and the upper second charge transport layer.

2. The solar cell of claim 1, wherein the upper electrode is exposed to an outside of the upper absorption layer.

3. The solar cell of claim 1, wherein the upper passivation layer, the transparent electrode, the upper first charge transport layer, and the upper electrode are disposed on the functional layer on one side thereof, and wherein the upper second charge transport layer is disposed on the functional layer on an opposite side thereof.

4. The solar cell of claim 3, wherein each of the upper passivation layer, the transparent electrode, and the upper first charge transport layer includes a body part (311, 321, and 331) disposed on the functional layer on the one side, and at least one extension part 312, 322, and 332 extending from the body part to the opposite side, and wherein the upper second charge transport layer includes a body part (351) disposed on the functional layer on the opposite side, and at least one extension part (352) extending from the body part to the one side.

5. The solar cell of claim 4, wherein a length of the body part of the upper first charge transport layer in a first direction is different from a length of the body part of the upper passivation layer, and wherein the first direction and a second direction are perpendicular to each other, and are directions that are parallel to the upper surface of the functional layer.

6. The solar cell of claim 4, wherein the functional layer contacts the upper absorption layer in an area, in which the upper passivation layer and the upper second charge transport layer are spaced apart from each other.

7. The solar cell of claim 4, wherein the upper second charge transport layer is a recombination layer.

8. The solar cell of claim 7, wherein the lower cell includes:
a lower electrode;
a reflective layer disposed on an upper surface of the lower electrode;
a lower passivation layer disposed on an upper surface of the reflective layer;
a lower functional layer disposed on an upper surface of the lower passivation layer; and
a lower absorption layer disposed on an upper surface of the lower functional layer.

9. The solar cell of claim 8, wherein the lower absorption layer is a p-type semiconductor or an n-type semiconductor, and wherein the functional layer is an n-type semiconductor or a p-type semiconductor in correspondence to the lower absorption layer.

10. The solar cell of claim 9, wherein the lower absorption layer is a silicon semiconductor,
wherein the functional layer is a p-n junction layer, and
wherein the lower functional layer is a back surface field (BSF).

11. The solar cell of claim 8, wherein the upper absorption layer generates an electron hole pair by absorbing a middle wavelength and a short wavelength, and wherein the lower absorption layer generates an electron hole pair by absorbing a middle wavelength and a long wavelength.

12. A solar cell comprising:
a lower cell;
a middle cell disposed on the lower cell; and
an upper cell disposed on the middle cell,
wherein the upper cell includes:
an upper passivation layer disposed on an upper surface of the middle cell;
a transparent electrode disposed on an upper surface of the upper passivation layer;
an upper first charge transport layer disposed on an upper surface of the transparent electrode;
an upper electrode disposed on the upper surface of the transparent electrode to be adjacent to the upper first charge transport layer;
an upper second charge transport layer disposed on an upper surface of the middle cell to be spaced apart from the upper passivation layer, the transparent electrode, the upper first charge transport layer, and the upper electrode; and
an upper absorption layer disposed on the upper passivation layer, the transparent electrode, the upper first charge transport layer, and the upper second charge transport layer.

13. The solar cell of claim 12, wherein the lower cell includes:
a lower electrode;
a reflective layer disposed on an upper surface of the lower electrode;
a lower passivation layer disposed on an upper surface of the reflective layer;
a lower functional layer disposed on an upper surface of the lower passivation layer; and
a lower absorption layer disposed on an upper surface of the lower functional layer.

14. The solar cell of claim 13, wherein the middle cell includes:
a middle first charge transport layer disposed on an upper surface of the lower absorption layer;
a middle recombination layer disposed on the middle first charge transport layer;
a middle second charge transport layer disposed on an upper surface of the middle recombination layer; and
a middle absorption layer disposed on an upper surface of the middle second charge transport layer.

15. A solar cell module comprising:
a first solar cell; and
a second solar cell electrically connected onto the first solar cell,
wherein each of the first solar cell and the second solar cell includes:
a lower cell;
a functional layer disposed on the lower cell; and
an upper cell disposed on the functional cell, and
wherein the upper cell includes:
an upper passivation layer disposed on an upper surface of the functional layer;
a transparent electrode disposed on an upper surface of the upper passivation layer;
an upper first charge transport layer disposed on an upper surface of the transparent electrode;

an upper second charge transport layer disposed on an upper surface of the functional layer to be spaced apart from the upper passivation layer, the transparent electrode, the upper first charge transport layer, and the upper electrode; and an upper absorption layer disposed on the upper passivation layer, the transparent electrode, the upper first charge transport layer, and the upper second charge transport layer.

16. The solar cell module of claim 15, wherein the upper cell of the second solar cell further includes:

an upper electrode disposed on the upper surface of the transparent electrode to be adjacent to the upper first charge transport layer.

17. The solar cell module of claim 15, wherein the upper adsorption layer of the upper cell of the first solar cell is spaced apart from the second solar cell.

18. The solar cell module of claim 15, wherein the upper cell of the first solar cell further includes:

an upper electrode disposed on the upper surface of the transparent electrode to be adjacent to the upper first charge transport layer.

19. The solar cell module of claim 15, wherein a portion of the lower absorption layer of the second solar cell directly contacts the transparent of the first solar cell.

20. The solar cell module of claim 15, wherein a plurality of middle cells are provided, and wherein each of the plurality of middle cells absorbs light of a specific wavelength.

\* \* \* \* \*